US009877104B2

(12) United States Patent
Huang et al.

(10) Patent No.: US 9,877,104 B2
(45) Date of Patent: Jan. 23, 2018

(54) AUDIO SWITCH CIRCUIT WITH SLOW TURN-ON

(71) Applicant: Fairchild Semiconductor Corporation, San Jose, CA (US)

(72) Inventors: Lei Huang, Beijing (CN); Julie Stulz, Scarborough, ME (US); Eric Li, Beijing (CN)

(73) Assignee: Fairchild Semiconductor Corporation, San Jose, CA (US)

(*) Notice: Subject to any disclaimer, the term of this patent is extended or adjusted under 35 U.S.C. 154(b) by 29 days.

(21) Appl. No.: 14/748,066

(22) Filed: Jun. 23, 2015

(65) Prior Publication Data
US 2016/0182040 A1   Jun. 23, 2016

Related U.S. Application Data

(60) Provisional application No. 62/093,040, filed on Dec. 17, 2014.

(51) Int. Cl.
| | |
|---|---|
| *H04R 3/00* | (2006.01) |
| *H03K 17/16* | (2006.01) |
| *H03K 17/687* | (2006.01) |
| *H03F 1/30* | (2006.01) |

(52) U.S. Cl.
CPC .............. *H04R 3/00* (2013.01); *H03K 17/166* (2013.01)

(58) Field of Classification Search
CPC .. H03K 17/163; H03K 17/166; H03K 17/687; H04R 3/00; H04R 3/007; H03F 1/305; H03F 2200/417

USPC .................................................. 327/170, 394
See application file for complete search history.

(56) References Cited

U.S. PATENT DOCUMENTS

| | | | | |
|---|---|---|---|---|
| 7,492,207 | B2* | 2/2009 | Cornelissens | H03K 17/063 327/365 |
| 8,194,379 | B2* | 6/2012 | Herr | H03K 17/0822 361/93.9 |
| 8,289,066 | B2* | 10/2012 | Guo | H03K 17/04123 327/419 |
| 8,344,789 | B2* | 1/2013 | Webb | H03K 17/007 327/404 |
| 8,564,359 | B2* | 10/2013 | Brauer | H03K 17/166 327/427 |
| 2009/0058496 | A1* | 3/2009 | Kapoor | G05F 3/242 327/391 |
| 2010/0128899 | A1* | 5/2010 | Wong | H03F 1/305 381/94.5 |

* cited by examiner

*Primary Examiner* — Lincoln Donovan
*Assistant Examiner* — Colleen O Toole
(74) *Attorney, Agent, or Firm* — Okamoto & Benedicto LLP (57) ABSTRACT

An audio switch circuit includes negative feedback paths and a transistor that serves as a switching component. The negative feedback paths are turned ON to couple a source voltage and a drain voltage of the transistor to the gate of the transistor when the audio switch circuit is turned ON. The negative feedback paths reduce the slew rate of the gate-to-source voltage of the transistor, thereby slowing the turn-ON of the audio switch circuit to prevent or minimize unwanted audible noise. The negative feedback paths can be turned OFF after a period of time after the audio switch circuit is turned ON for improved total harmonic distortion.

15 Claims, 5 Drawing Sheets

SLOW TURN-ON MODE

FIG. 1

NORMAL MODE

AUDIO SWITCH CIRCUIT WITH SLOW TURN-ON

CROSS-REFERENCE TO RELATED APPLICATION

This application claims the benefit of U.S. Provisional Application No. 62/093,040, filed on Dec. 17, 2014, which is incorporated herein by reference in its entirety.

BACKGROUND OF THE INVENTION

1. Field of the Invention

The present invention relates generally to electrical circuits, and more particularly but not exclusively to audio switch circuits.

2. Description of the Background Art

An audio switch circuit switches an audio signal from one node to another. Audio switch circuits are employed in a variety of devices, such as in micro Universal Serial Bus switch (MUS) devices. For example, in an MUS device, an audio switch circuit can be employed to switch an audio signal between an audio source and a Universal Serial Bus (USB) port. One problem with switching audio signals is that undesirable audible noise, such as pops and clicks, can be generated when the audio switch circuit is turned ON.

SUMMARY

In one embodiment, an audio switch circuit includes negative feedback paths and a transistor that serves as a switching component. The negative feedback paths are turned ON to couple a source voltage and a drain voltage of the transistor to the gate of the transistor when the audio switch circuit is turned ON. The negative feedback paths reduce the slew rate of the gate-to-source voltage of the transistor, thereby slowing the turn-ON of the audio switch circuit to prevent or minimize unwanted audible noise. The negative feedback paths can be turned OFF after a period of time after the audio switch circuit is turned ON for improved total harmonic distortion.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In the present disclosure, transistors that are labeled with an "N" (e.g., NSW, N1, N2, etc.) are N-type metal oxide semiconductor (NMOS) transistors and transistors that are labeled with a "P" (e.g., P1, P2, etc.) are P-type metal oxide semiconductor (PMOS) transistors. As can be appreciated, the provided transistor types are for illustration purposes only. Other transistors may also be used depending on the particulars of the audio switch circuit.

Figure 1:
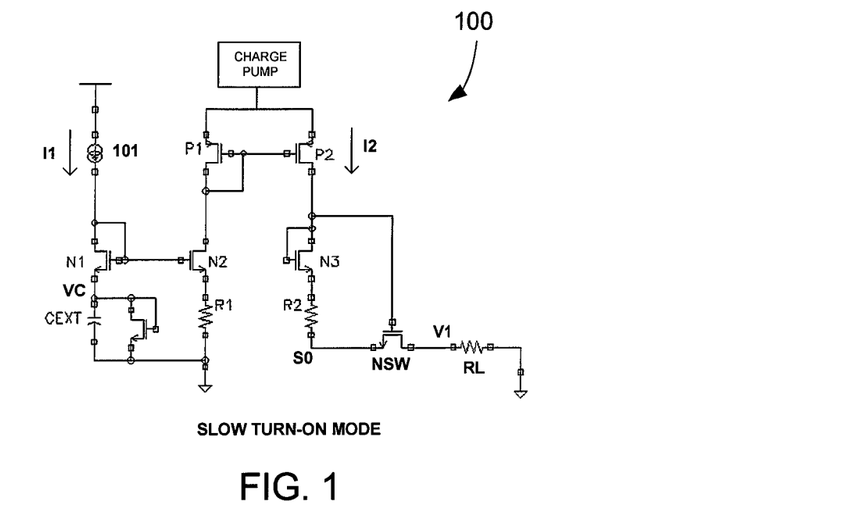
FIG. 1 shows a schematic diagram of an audio switch circuit in slow turn-ON mode in accordance with an embodiment of the present invention.

FIG. 1 shows a schematic diagram of an audio switch circuit 100 in accordance with an embodiment of the present invention. In the example of FIG. 1, the audio switch circuit 100 only operates in slow turn-ON mode, in which a switch component in the form of an NMOS transistor NSW is slowly turned ON to remove or minimize undesirable audible pops and clicks that can occur when the audio switch circuit 100 is turned ON. In the example of FIG. 1, the transistor NSW is employed to switch an audio signal coupled to the source of the transistor NSW to a load coupled to the drain of the transistor NSW. As can be appreciated, embodiments of the present invention may also be employed in other applications requiring a slow turn-ON switch.

In the example of FIG. 1, the load is represented by a load resistor RL (e.g., 50Ω). An audio signal may be received at a node S0. When the audio switch circuit 100 is ON, the transistor NSW is ON to allow an audio signal to flow from the source to the drain of the transistor NSW, thereby allowing the audio signal to reach the load. When the audio switch circuit 100 is OFF, the transistor NSW is OFF to block the audio signal from reaching the load. For ease of illustration, the transistor NSW substrate connection is omitted in FIG. 1; the substrate connection of the transistor NSW may be the minimum voltage on its source and drain. Also, a diode-connected NMOS transistor may be connected to the capacitor CEXT to clamp the capacitor voltage VC. Other clamp circuits may also be employed to limit the peak value of the capacitor voltage VC.

In the example of FIG. 1, a charge pump circuit, or another voltage source, provides a charge pump voltage on the source of the transistors P1 and P2. The charge pump voltage is used to generate a current I2 that develops a voltage drop on the resistor R2. In the example of FIG. 1, the gate-to-source voltage VGS of the transistor NSW is from the voltage drop on the resistor R2 and the gate-to-source voltage VGS of the transistor N3.

An audio signal develops an output voltage signal V1 on the load represented by the load resistor RL. In the example of FIG. 1, the slew rate of the output voltage signal V1 can be controlled to be about 10V/S, which is not audible. A transistor N1 is used to pre-charge the transistor N3 to the threshold voltage Vth so that delay time can be reduced. In the example of FIG. 1, the current through the transistor N2 is approximately the same as $$I2 = \frac{VC}{R1} = \frac{I1 * T}{CEXT * R1} \quad \text{(EQ. 1)}$$

where VC is the voltage on the capacitor CEXT, I1 is the current generated by a current source 101, and T is the charging time of the capacitor CEXT. The transistor N3 and resistor R2 are used to generate the gate-to-source voltage VGS of the transistor NSW, which is $$VGS(N3) + (R2*I2) = VGS(N3) + R2\frac{I1*T}{CEXT*R1} \quad (EQ.\ 2)$$

where VGS(N3) is the gate-to-source voltage VGS of the transistor N3. Therefore, in the example of FIG. 1, the ON resistance Ron of the transistor NSW can be controlled by properly choosing the parameters of the audio switch circuit 100. The node S0 of the resistor R2 can be connected to the source or drain of the transistor NSW depending on which one has the smaller voltage. That is, the node S0 of the resistor R2 can be connected to the minimum of the source voltage and the drain voltage of the transistor NSW (min(S, D)). For example, the drain of the transistor NSW can be connected to the resistor R2 when the drain voltage of the transistor NSW is smaller than the source voltage of the transistor NSW, in which case the source of the transistor NSW is connected to the load resistor RL. The connection to the minimum voltage may be performed by, for example, a cross-coupling circuit (not shown). The source of the transistor NSW can be connected to the resistor R2 as in FIG. 1 when the source voltage of the transistor NSW is smaller than the drain voltage of the transistor NSW.

Figure 2:
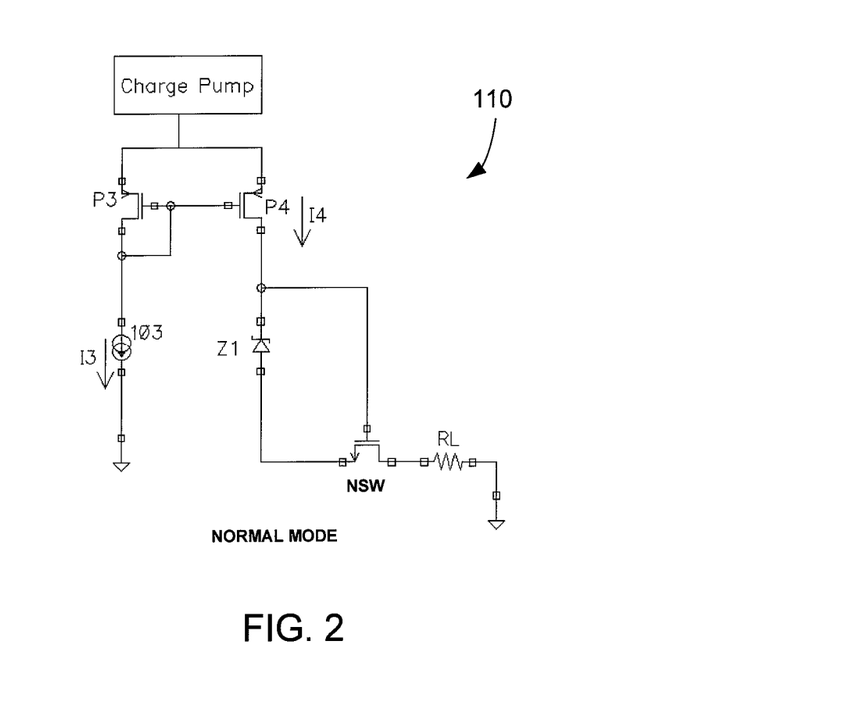
FIG. 2 shows a schematic diagram of an audio switch circuit in normal mode in accordance with an embodiment of the present invention.

FIG. 2 shows a schematic diagram of an audio switch circuit 110 in accordance with an embodiment of the present invention. In one embodiment, the audio switch circuit 100 only operates in normal mode. Generally speaking, audio switch circuits that operate in normal mode have lower total harmonic distortion (THD) compared to those that operate in slow turn-ON mode.

In the example of FIG. 2, the transistors P3 and P4 form a current mirror that generates a current I4 from a current I3 generated by a current source 103. In the example of FIG. 2, the gate-to-source voltage VGS of the transistor NSW is from the voltage drop generated by the current I4 on the impedance Z1, which can be a Zener diode, resistor, or some other impedance. An audio signal may be switched from the source of the transistor NSW to a load resistor RL connected to the drain of the transistor NSW as in the audio switch circuit 100. Note, however, that unlike the audio switch circuit 100, the audio switch circuit 110 has no provision for slowing the turn-ON of the transistor NSW when the audio switch circuit 110 is turned ON. This may result in undesirable audible noise during turn-ON, which is especially troublesome in audio applications.

Figure 3:
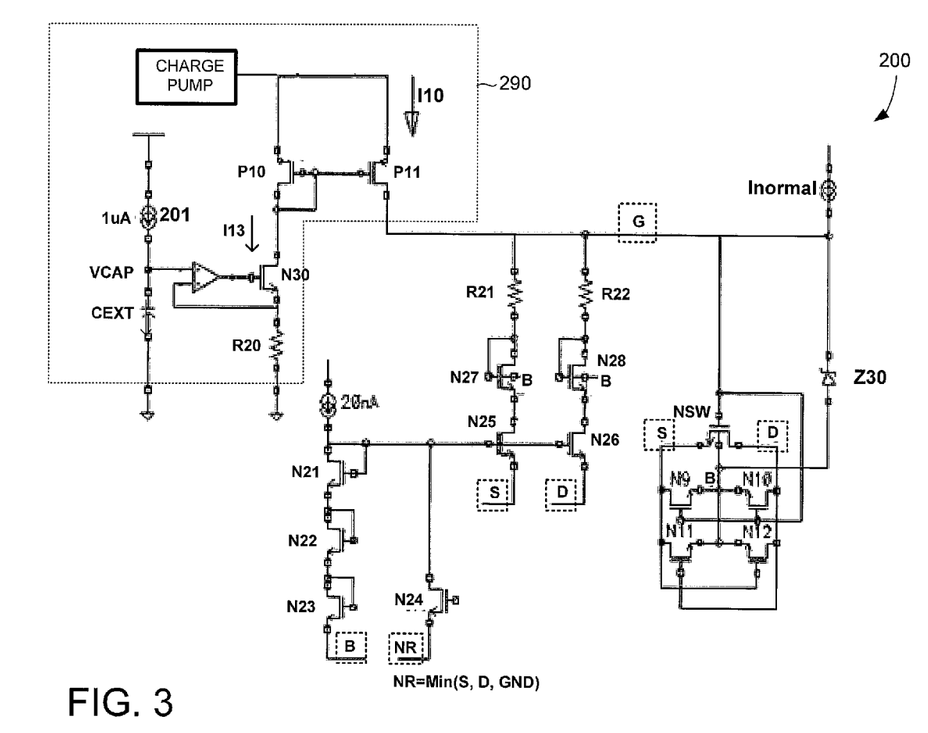
FIG. 3 shows a schematic diagram of an audio switch circuit in accordance with an embodiment of the present invention.

FIG. 3 shows a schematic diagram of an audio switch circuit 200 in accordance with an embodiment of the present invention. In one embodiment, the audio switch circuit 200 is implemented as an integrated circuit (IC) chip with its own packaging.

In the example of FIG. 3, the switch component of the audio circuit 200 is the transistor NSW. When the audio switch circuit 200 is ON, the transistor NSW is ON to allow an audio signal to pass through the source and drain of the transistor NSW. The audio signal may be coupled to the source of the transistor NSW and a load (not shown in FIG. 3; e.g., see FIGS. 1 and 2, resistor RL) may be coupled to the drain of the transistor NSW. The output voltage of the audio circuit 200 may be on the drain of the transistor NSW. As can be appreciated, because the topology of the audio switch circuit 200 in the example FIG. 3 is symmetric, an audio source can be connected to either the source or the drain of the transistor NSW.

In one embodiment, the audio switch circuit 200 is configured to automatically change operation from slow turn-ON mode (like the audio circuit 100 of FIG. 1) to normal mode (like the audio switch circuit 110 of FIG. 2). Advantageously, the audio switch circuit 200 can operate in slow turn-ON mode to prevent undesirable audible noises when the audio switch circuit 200 is turned ON, and operate in normal mode thereafter to obtain lower THD during normal operation.

In the example of FIG. 3, the nodes on the gate, source, and drain of the transistor NSW are labeled as "G", "S", and "D", respectively. The nodes G, S, D, B, and NR are bounded by dashed lines in FIG. 3 for ease of identification. In the example of FIG. 3, the voltage on the node NR is set to be the minimum of the voltage on the nodes S, D, and ground, which may be provided by, for example, a cross-coupling circuit (not shown). Generally speaking, either the node NR or B may be used depending on the gate-to-drain breakdown voltage of the transistors N25 and N26. If the transistors N25 and N26 are high voltage NMOS transistors (i.e., can have large absolute gate-to-drain breakdown voltage), the node NR can be used. When the transistors N25 and N26 are regular NMOS transistors, the node B can be used (e.g., see FIG. 5).

When the absolute value of the voltage on the drain or source of the transistor NSW is decreasing across the drain saturation voltage VDSAT of the transistor NSW, the transistor NSW changes operation from the saturation region to the linear region and its I-V (current-voltage) curve changes a lot. To address this situation, in the example of FIG. 3, the source and drain of the transistor NSW are coupled to provide negative feedback to the gate of the transistor NSW.

In the example of FIG. 3, the source of the transistor NSW is coupled to the gate of the transistor NSW through a first negative feedback path formed by the transistor N25, transistor N27, and resistor R21. Similarly, the drain of the transistor NSW is coupled to the gate of the transistor NSW through a second negative feedback path formed by the transistor N26, the transistor N28, and the resistor R22. The first negative feedback path is turned ON when the transistor N25 is turned ON, and the second negative feedback path is turned ON when the transistor N26 is turned ON.

In the example of FIG. 3, the drain of the transistor N25 is connected to the source of the transistor N27, the gate of the transistor N27 is connected to the drain of the transistor N27, the drain of the transistor N27 is connected to an end of the resistor R21, and the opposing end of the resistor R21 is connected to the gate of the transistor NSW. Similarly, the drain of the transistor N26 is connected to the source of the transistor N28, the gate of the transistor N28 is connected to the drain of the transistor N28, the drain of the transistor N28 is connected to an end of the resistor R22, and the opposing end of the resistor R22 is connected to the gate of the transistor NSW. The source of the transistor N25 is connected to the source of the transistor NSW and the source of the transistor N26 is connected to the drain of the transistor NSW. The gates of the transistors N25 and N26 are tied together.

When the voltage on the source and drain of the transistor NSW is below B+3Vth (where B is the voltage on node B and 3Vth is the Vth of the transistors N21, N22, and N23; other Vth levels sufficient to turn ON the transistors N25 and N26 (and N60 for FIG. 5) may also be used) then both the first and second negative feedback paths are ON and the source voltage and drain voltage of the transistor NSW cannot change too fast. Accordingly, the turn-ON of the transistor NSW is slowed to prevent undesirable audible noises. This is also referred to as slow turn-ON mode and occurs when the audio switch circuit 200 is turned-ON, such as when the audio switch circuit 200 is powered up from an OFF state. In the slow turn-ON mode, the audio switch circuit 200 operates in similar fashion as the audio switch circuit 100 of FIG. 1.

In the example of FIG. 3, a slew rate current I10 is generated by a bias circuit 290. In one embodiment, the bias circuit 290 is configured to generate the current I10 during startup and then turn OFF the current I10 after a period of time, which may be dictated by the charging of a capacitor CEXT. In the example of FIG. 3, a charge pump allows for generation of a current I13, which is mirrored by a current mirror formed by transistors P10 and P11 to generate the current I10. A current source 201 generates a charge current (e.g., 1 µA) that charges a capacitor CEXT to develop a capacitor voltage VCAP, which controls the gate-to-source voltage of a transistor N30. Accordingly, the slew rate current I10 is generated for a period of time (e.g., predetermined time or up to when the capacitor voltage VCAP reaches a certain level) after the audio switch circuit 200 is turned ON to allow for slow turn-ON mode of operation during startup, and the slew rate current I10 is thereafter turned OFF to allow for normal mode of operation during steady state.

In one embodiment, the capacitor CEXT is external to the IC chip packaging of the audio switch circuit 200. An internal, integrated capacitor (not shown) can also be used by choosing a proper resistor R21 and resistor R22 ratio. A typical value of the capacitor CEXT when it is external is about 0.1 uF, and a 1 uA current source 201 can be used to charge the capacitor CEXT to get a slow slew rate. Instead of using an external capacitor CEXT, a relatively small charge current (e.g., 10 nA) can be used to charge an integrated capacitor (e.g., 100 pF) and a proper R21, R22 ratio can be chosen to get the same slew rate effect. More particularly, in the example of FIG. 3, the charge current generated by the current source 201 can be 1 uA and the capacitor CEXT can be 0.1 uF because it is external. If an integrated capacitor is used with a capacitance of 100 pF, for example, the charge current can be reduced and the resistors R22 and R21 can be changed to obtain a proper ratio to get a similar slow down of the gate-to-source voltage VGS of the transistor NSW.

In the example of FIG. 3, after a period of time after the audio switch circuit 200 is turned ON, the gate of the transistors N25 and N26 are pulled down the node NR (which is min(S,D,GND)), the transistors N25 and N26 are OFF, the current I10 turns OFF, and the current Inormal turns ON to automatically transition the audio switch circuit 200 to operate in normal mode. The duration of the slow turn-ON mode may be predetermined, controlled by another circuit, or based on when the capacitor voltage VCAP reaches a predetermined level. In the example of FIG. 3, the current I10 is only used in slow turn-ON mode and the current Inormal is used to generate a voltage across the impedance Z30.

In slow turn-ON mode, the first and second negative feedback paths are ON, and the gate-to-source voltage VGS of the transistor NSW is from the voltage drop on the first negative feedback path (i.e., the voltage on the resistor R21 and the gate-to-source voltage VGS of the transistor N27). In normal mode, the first and second negative feedback paths are OFF. Accordingly, the gate-to-source voltage VGS of the transistor NSW is from the voltage drop on the impedance Z30.

In the example of FIG. 3, the gates of the transistors N9 and N10 are connected to the node G (i.e., the gate of the transistor NSW). When the node G is HIGH, the transistors N9 and N10 are turned ON and function as a resistor divider network, so B=(S+D)/2. The transistors N11 and N12 cross couples the nodes S and D and are used to choose B=min (S,D) (drain-to-source voltage Vds of the transistor NSW needs to be high enough to turn on the transistors N11 and N12). The transistors N9 and N10 are used for normal transistor NSW ON state, where the voltage Vds of the transistor NSW is low. The transistors N11 and N12 are used in the transistor NSW OFF state, where the voltage Vds of the transistor NSW can be high. As can be appreciated, a similar circuit topology may be employed to select the minimum of S, D, and GND for the node NR.

It is to be noted that in the example of FIG. 3, the transistors N11 and N12 can select the node B to be the minimum of nodes S and D, i.e., B=min(S, D) if the sources of the transistors N25 and N26 are connected to B=min(S, D). Suppose S<D, so B=S, when VDS is close to VGS, G and the output voltage signal can change much faster. If both S and D are used as in FIG. 3, i.e., the source of the transistor NSW is connected to the source of the transistor N25 and the drain of the transistor NSW is connected to the source of the transistor N26, then if D gets lower, G will be lower too, which is negative feedback.

Figure 4:
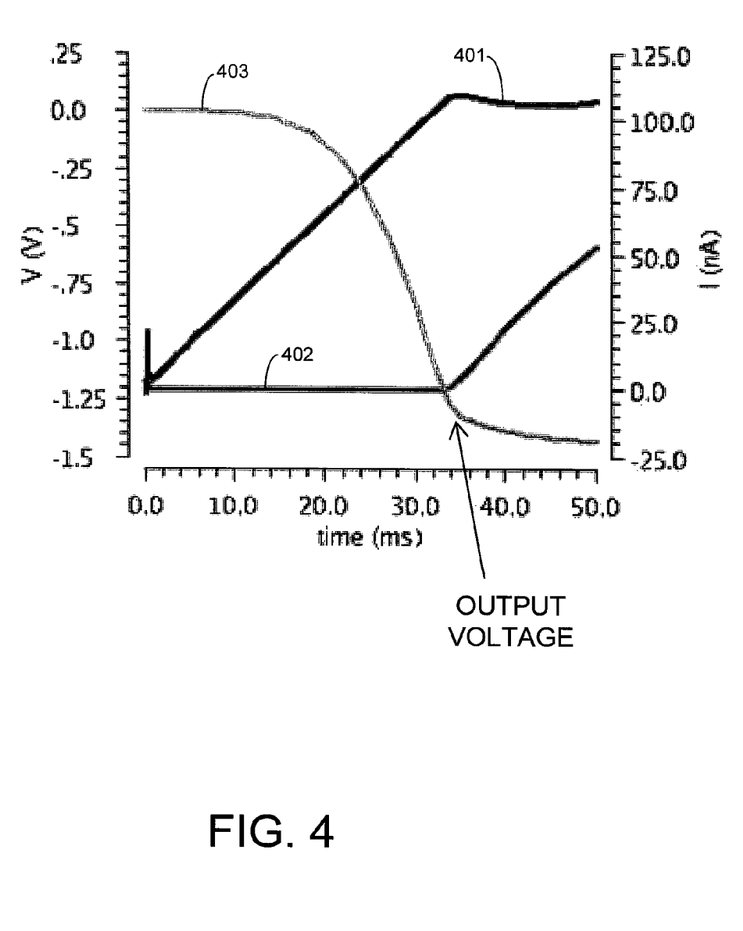
FIG. 4 shows simulation results for the audio switch circuit of FIG. 3.

FIG. 4 shows simulation results for the audio switch circuit 200 in the example of FIG. 3. FIG. 4 shows a waveform 401 of the current through the transistor N27, a waveform 402 of the current through the transistor N28, and a waveform 403 of the output voltage (on the drain of the transistor NSW in FIG. 3). The simulation results of FIG. 4 confirm that the slew rate of the output voltage signal is reduced when the first and negative feedback paths are ON.

Figure 5:
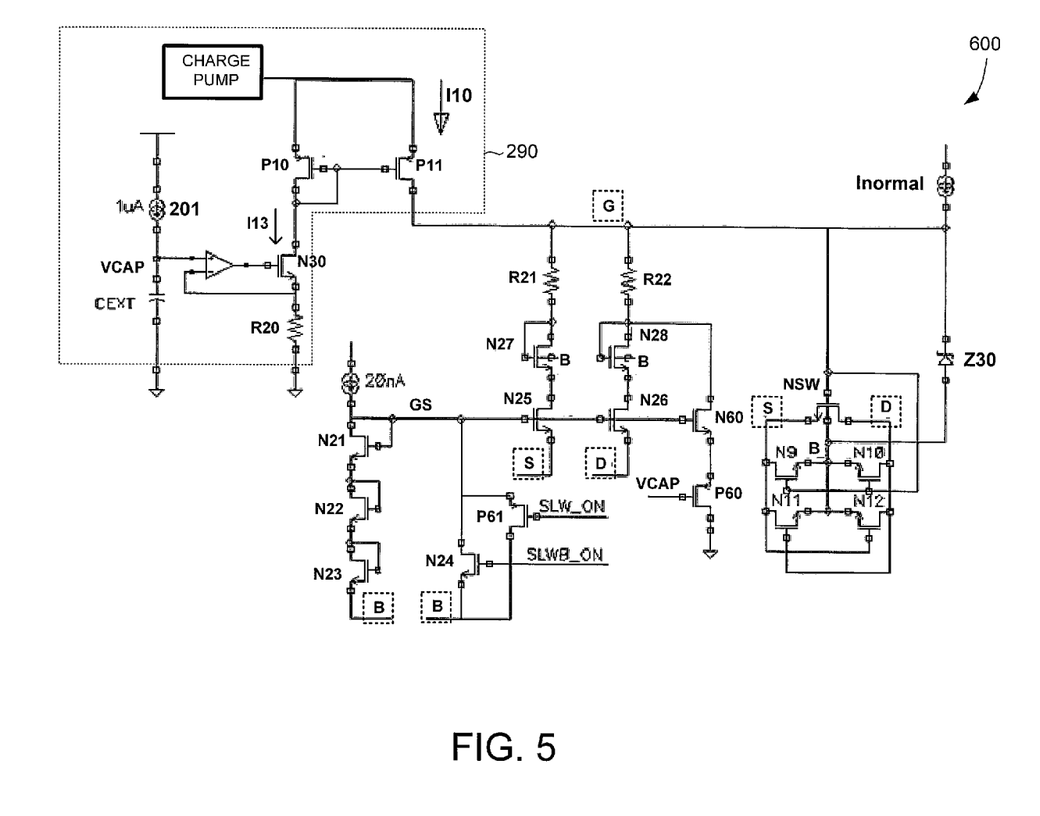
FIG. 5 shows a schematic diagram of an audio switch circuit in accordance with an embodiment of the present invention.

FIG. 5 shows a schematic diagram of an audio switch circuit 600 in accordance with an embodiment of the present invention. The audio switch circuit 600 is similar to the audio switch circuit 200 of FIG. 3, with the addition of a PMOS transistor P60, PMOS transistor P61, and an NMOS transistor N60. The source of the transistor N24 is connected to the node B in the example of FIG. 5.

In the example of FIG. 5, when the transistor N60 is turned ON, the node G can be clamped to VCAP+abs(VGS (P60)). That is, the transistor N60 allows for clamping the gate of the transistor NSW to the capacitor voltage VCAP plus the gate-to-source voltage of the transistor P60. The transistor N24 and the transistor P61 allow for pulling down the node GS to B=min(S, D) to turn OFF the transistors N25, N26, and N60. The audio switch circuit 600 otherwise operates similarly to the audio switch circuit 200 of FIG. 3.

In the example of FIG. 5, the signal SLW_ON is a logic signal that when HIGH indicates that the audio switch circuit 600 is in slow turn-ON mode. The signal SLWB_ON is an inverted version of the signal SLW_ON, as the HIGH level of the signal SLWB_ON may not be high enough to turn ON the transistor N24 to pull down the node GS to the node B. In that case, the signal SLW_ON is low enough to turn ON the transistor P61 to pull down the node GS to the node B. That is, the transistors P61 and N24 form a CMOS switch for shorting the nodes GS and B when not in slow turn-ON mode. The signals SLW_ON and SLWB_ON may be generated by an additional circuit (not shown), which asserts the signal SLW_ON to be HIGH when the slow turn-ON mode period has not expired and the capacitor voltage VCAP has not reach the level to transition to the normal mode.

Figure 6:
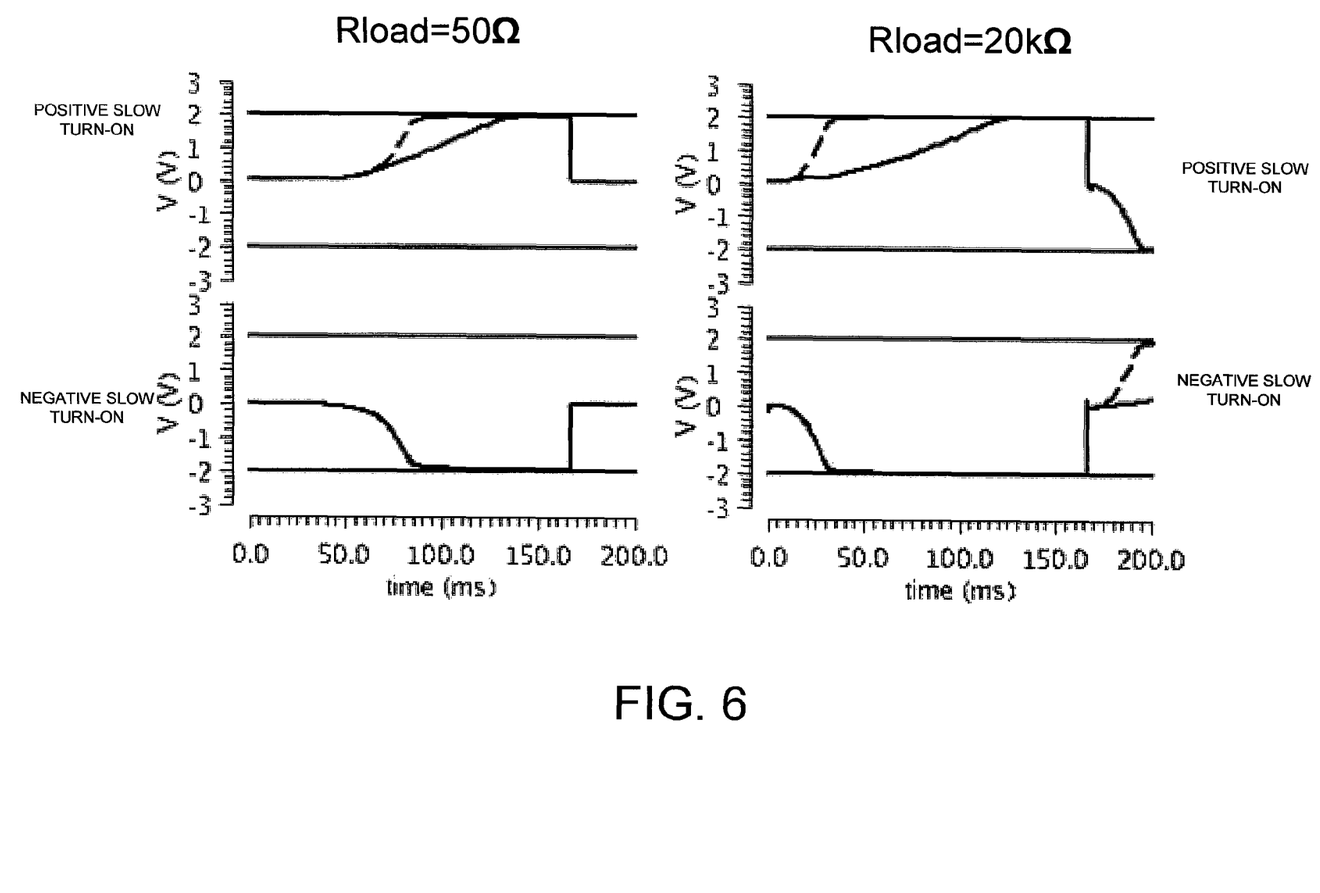
FIG. 6 shows simulation results for audio switch circuit of FIG. 5.

FIG. 6 shows simulation results for the audio switch circuit 600. In the example of FIG. 8, the plots on the left are for the load resistance Rload=50Ω and the plots on the right are for a load resistance Rload=20 kΩ. The top plots are for positive slow turn-ON and the bottom plots are for negative slow turn-ON.

In the example of FIG. 6, for positive slow turn-ON, the dashed curve is for the slow turn-ON of the output voltage without the clamp circuit comprising the transistors P60 and N60; the solid curve is for the slow turn-ON of the output voltage with the transistors P60 and N60. For negative slow turn-ON, the curves for the slow turn-ON output voltage for the audio switch circuit 600 with and without the transistors P60 and N60 overlap. This shows that the slew rate of the output voltage can be readily slowed down by using the capacitor to clamp the NSW gate voltage.

Audio switch circuits with slow turn-ON have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A switch circuit comprising:
   a first transistor having a gate, a source, and a drain;
   a first negative feedback path comprising a first resistor and a second transistor, the second transistor being configured to turn ON to couple a source voltage of the first transistor to the gate of the first transistor during a first mode of operation;
   a second negative feedback path comprising a second resistor and a third transistor, the third transistor being configured to turn ON to couple a drain voltage of the first transistor to the gate of the first transistor during the first mode of operation;
   a fourth transistor that is configured to pull down a gate of the second transistor and a gate of the third transistor to a minimum of the source voltage of the first transistor, the drain voltage of the first transistor, and ground during a second mode of operation; and
   a bias circuit comprising a capacitor and a first current source, the bias circuit being configured to generate a slew rate current by charging the capacitor with current from the current source,
   wherein the slew current flows to the first negative feedback path to develop a first gate-to-source voltage of the first transistor during the first mode of operation, the slew rate current is turned off in the second mode of operation, and the second and third transistors are turned off during the second mode of operation
   wherein the first transistor couples a signal through the source and the drain of the first transistor when the switch circuit is turned ON.

2. The switch circuit of claim 1, wherein the bias circuit further comprises:
   a current mirror that mirrors a first current to generate the slew rate current.

3. The switch circuit of claim 2, wherein the bias circuit further comprises:
   a circuit stage that turns OFF the first current when the capacitor is charged to a predetermined capacitor voltage.

4. The switch circuit of claim 2, further comprising:
   a second current source that generates the gate-to-source voltage of the first transistor on an impedance when the slew rate current turns OFF.

5. The switch circuit of claim 1, wherein the first transistor is an MOS transistor.

6. The switch circuit of claim 1, wherein the signal is an audio signal.

7. A method of controlling a switch, the method comprising:
   generating a slew rate current from a first current source;
   generating a first gate-to-source voltage at a slew rate dictated by the slew rate current;
   during a first mode of operation, applying the first gate-to-source voltage across a gate and a source of a first transistor;
   during the first mode of operation, applying a minimum of a source voltage of the first transistor and a drain voltage of the first transistor to the gate of the first transistor;
   generating a normal mode current from a second current source that is different from the first current source;
   after a period of time after the transistor is turned ON, transitioning from the first mode of operation to a second mode operation;
   during the second mode of operation, generating a second gate-to-source voltage using the second current source and applying the second gate-to-source voltage instead of the first gate-to-source voltage across the gate and the source of the first transistor;
   and
   transmitting a signal through the source and the drain of the first transistor.

8. The method of claim 7, wherein the signal comprises an audio signal.

9. The method of claim 7, wherein generating the first gate-to-source voltage comprises:
   turning ON a first negative feedback path that couples the gate of the first transistor to the source of the first transistor; and
   using the slew rate current to develop a voltage on the negative feedback path.

10. The method of claim 9, wherein generating the first gate-to-source voltage further comprises:
    turning ON a second negative feedback path that couples the gate of the first transistor to the drain of the first transistor.

11. The method of claim 10, wherein applying the second gate-to-source voltage instead of the first gate-to-source voltage across the gate and the source of the first transistor comprises:
    turning OFF the first and second negative feedback paths; and
    using a diode to provide the second gate-to-source voltage.

12. A switch circuit comprising:
    a first transistor having a gate, a source, and a drain;
    a negative feedback path that couples a minimum of a source voltage of the first transistor and a drain voltage of the first transistor to the gate of the first transistor when the switch circuit is turned ON; and
    a bias circuit that generates a slew rate current, the slew rate current flowing to the negative feedback path to develop a first gate-to-source voltage across the gate and the source of the first transistor on the negative feedback path, the first gate-to-source voltage having a slew rate that is based on the slew rate current when the switch circuit is turned ON.

13. The switch circuit of claim 12, wherein the bias circuit comprises:
a current mirror that mirrors a first current to generate the slew rate current.

14. The switch circuit of claim 13, wherein the bias circuit further comprises:
a capacitor;
a first current source that generates a charging current that charges the capacitor; and
a circuit stage that turns OFF the first current when the capacitor is charged to a predetermined capacitor voltage.

15. The switch circuit of claim 13, wherein the switch circuit is an integrated circuit chip, and the capacitor is external to the integrated circuit chip.

* * * * *